(12) United States Patent
Yoshino et al.

(10) Patent No.: US 8,129,820 B2
(45) Date of Patent: Mar. 6, 2012

(54) SEMICONDUCTOR DEVICE

(75) Inventors: Hideo Yoshino, Chiba (JP); Hisashi Hasegawa, Chiba (JP)

(73) Assignee: Seiko Instruments Inc. (JP)

( * ) Notice: Subject to any disclaimer, the term of this patent is extended or adjusted under 35 U.S.C. 154(b) by 214 days.

(21) Appl. No.: 12/229,809

(22) Filed: Aug. 27, 2008

(65) Prior Publication Data

US 2009/0283864 A1    Nov. 19, 2009

(30) Foreign Application Priority Data

Aug. 30, 2007    (JP) ................... 2007-224124

(51) Int. Cl.
H01L 27/082    (2006.01)
H01L 29/66    (2006.01)
H01L 29/735    (2006.01)
(52) U.S. Cl. ................. 257/592; 257/566; 257/E29.187
(58) Field of Classification Search .................. 257/592, 257/593, E29.187, 565, 587, 588, E29.174, 257/E29.197, 401, 378, E29.242, E29.255, 257/216, 244, 235, 236, 365, 368, 288, E29.026, 257/E29.024, E29.005, E29.027, 577, E29.109, 257/370, E29.03, E29.031, E29.034, E29.044, 257/E29.045, 566; 438/364, 365, 366, 367, 335, 369, 339

See application file for complete search history.

(56) References Cited

U.S. PATENT DOCUMENTS

| 3,847,687 | A | * | 11/1974 | Davidsohn et al. | 438/353 |
| 5,444,291 | A | * | 8/1995 | Paparo et al. | 257/552 |
| 5,708,289 | A | * | 1/1998 | Blanchard | 257/355 |
| 2008/0308837 | A1 | * | 12/2008 | Gauthier et al. | 257/107 |

* cited by examiner

Primary Examiner — Phat Cao
Assistant Examiner — Diana C Vieira
(74) Attorney, Agent, or Firm — Adams & Wilks

(57) ABSTRACT

A bipolar transistor for semiconductor device has a collector region having a first conductivity type disposed on a surface of a semiconductor substrate having the first conductivity type. A base region having a second conductivity type is disposed in the collector region. An emitter region having the first conductivity type is disposed in the base region. A high concentration first conductivity type region for a collector electrode is disposed in the collector region. A high concentration second conductivity type region for a base electrode is disposed in the base region. The high concentration first conductivity type region for a collector electrode and the high concentration second conductivity type region for a base electrode contact directly with each other so that the collector region and the base region have a same potential.

10 Claims, 5 Drawing Sheets

SEMICONDUCTOR DEVICE

BACKGROUND OF THE INVENTION

1. Field of the Invention

The present invention relates to a semiconductor device using a bipolar transistor.

2. Description of the Related Art

In recent years, the application fields of power devices have expanded dramatically. The power devices are increasingly applied to wide ranges of fields such as consumer products, transportation, and information in addition to the industrial use. Along with the progress toward high frequency and high efficiency in application, large current capability is required to the power devices, and at the same time various peripheral circuits such as protection circuits and drive circuits are indispensable. Accordingly, the development of products having higher functions and higher reliability is advancing through incorporation of those circuits into a single module.

An example of the protection circuits is an overheat protection circuit. The overheat protection circuit has a function of preventing breakage or deterioration of internal parts due to overheat caused by extraordinary rise in the temperature within the semiconductor integrated circuit. The overheat protection circuit includes a part that works as a temperature sensor which sends a signal thereof when the temperature reaches a certain value, and a part that works to receive the signal to make the circuit off.

Various elements are used as the temperature sensor portion. And, examples in which a bipolar transistor is used are disclosed in the following documents.
Patent Document 1: JP 2004-294322A
Patent Document 2: JP 10-122976A

Problem to be Solved by the Invention

However, the inventions disclosed in JP 2004-294322A and JP 10-122976A each employs a bipolar transistor which is generally used, and hence those inventions are not considered from the viewpoint of reducing the area to lower its cost. For example, as shown in FIG. 6, a field oxide film 109 is arranged between an emitter region 104 and a base high concentration impurity region 103, and between the base high concentration impurity region 103 and a collector high concentration impurity region 105, preventing reduction in area.

SUMMARY OF THE INVENTION

Considering the above-mentioned problem of area reduction, which has been out of examination, the present invention has been made, and has an object to reduce a device size compared to the conventional structure, thereby reducing the area of a semiconductor integrated circuit, and to lower its manufacturing cost. Meanwhile, the present invention has another object to form the emitter region in a self-aligning manner to reduce variation in the device characteristics by suppressing variation in the size of the emitter region since the size of the emitter region contributes to the bipolar device characteristics.

Measure to Solve the Problem

In order to solve the above-mentioned problem, the present invention employs a bipolar transistor in which temperature characteristics of a forward voltage generated between an emitter and a base is used. More specifically, the present invention employs the following structures.

(1) A semiconductor device including a bipolar transistor, the bipolar transistor including: a collector region having a first conductivity type formed on a surface of a semiconductor substrate having a first conductivity type; a base region having a second conductivity type formed in the collector region; and an emitter region having a first conductivity type formed in the base region, the collector region including a high concentration first conductivity type region for a collector electrode, the base region including a high concentration second conductivity type region for a base electrode, in which the high concentration first conductivity type region for a collector electrode and the high concentration second conductivity type region for a base electrode are brought into direct contact with each other so that the collector region and the base region have an equal potential.

(2) A semiconductor device according to Item (1), in which the high concentration first conductivity type region for a collector electrode and the high concentration second conductivity type region for a base electrode are connected to each other at the same contact with the same metal electrode to have the equal potential.

(3) A semiconductor device, which is different in configuration from the semiconductor device according to Item (2), in which the high concentration first conductivity type region for a collector electrode and the high concentration second conductivity type region for a base electrode are connected to each other with the same metal electrode through different contacts and to have the equal potential.

(4) A semiconductor device according to Item (1), (2), or (3), in which the emitter region is formed in a self-aligning manner through a sheet of polycrystalline silicon arranged above the surface of the semiconductor substrate.

(5) A semiconductor device according to Item (4), in which the polycrystalline silicon has a second conductivity type.

(6) A semiconductor device according to Item (4) or (5), in which the polycrystalline silicon has a potential equal to a potential of the base region and the collector region.

(7) A semiconductor device according to Item (4) or (5), in which the polycrystalline silicon has a potential equal to a potential of the emitter region.

(8) A semiconductor device according to Item (1), (2), or (3), in which the emitter region is formed in a self-aligning manner with a device isolation insulating film.

BENEFIT OF THE INVENTION

In the bipolar transistor in which the temperature characteristics of the forward voltage generated between the emitter and the base is used, the high concentration impurity region for the base and the high concentration impurity region for the collector are brought into contact with each other to have an equal potential, permitting elimination of the device isolation region between the base and the collector, which enables reduction in the device size and the cost.

DETAILED DESCRIPTION OF THE PREFERRED EMBODIMENTS

A semiconductor device according to the present invention is a bipolar transistor in which temperature characteristics of a forward voltage generated between an emitter and a base is used. Particularly, the semiconductor device can be used for a temperature sensor or the like. A number of bipolar transistors have been proposed for use in this way, but the conventional bipolar transistors are not designed from the viewpoint of reduction in area. The present invention thus discloses a method of reducing the area of a bipolar transistor in which the temperature characteristics of the forward voltage generated between the emitter and the base is used. The method of reducing the area is described below.

First, because this bipolar transistor only needs the forward voltage, the base and the collector do not need to be reverse-biased and can have an equal potential. Then, consideration of breakdown voltage between the base and the collector, which has been necessary in a normal bipolar transistor, can be eliminated. Accordingly, device isolation provided between a high concentration region for a base electrode and a high concentration region for a collector electrode, which has been necessary to secure the breakdown voltage therebetween, can be eliminated, permitting reduction in device area. At the same time, the present invention proposes a manufacturing method in which suppression of the variation of the emitter region and reduction of variation in device characteristics are considered through formation of an emitter region in a self-aligning manner. Hereinafter, details of the present invention are described by using embodiments of a PNP bipolar transistor with reference to the drawings.

First Embodiment

Figure 1:
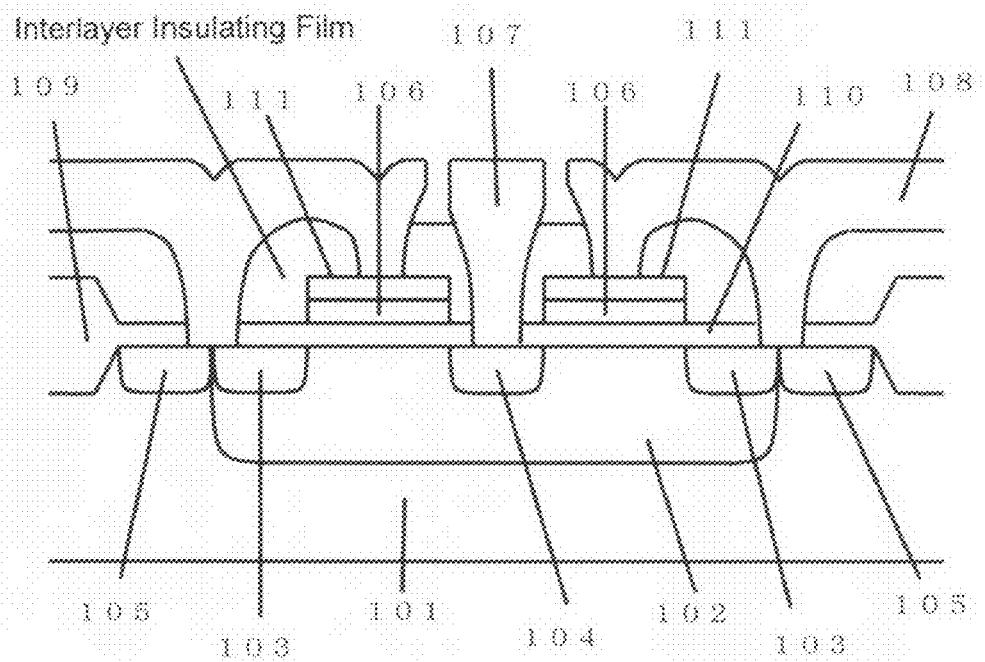
FIG. 1 is a sectional view of a bipolar transistor according to a first embodiment of the present invention.

FIG. 1 shows a sectional view of a bipolar transistor according to a first embodiment of the present invention. The sectional view is taken along the line A-A' of a plan view shown in FIG. 2. The bipolar transistor is described. A semiconductor substrate 101 is a p-type substrate and serves as a collector region. An n-type impurity region 102 serving as a base region is provided in the semiconductor substrate 101. In the n-type impurity region 102 serving as the base region, a (first) high concentration n-type impurity region for a base electrode 103 is provided so as to come into contact with the collector region. Further, in the n-type impurity region 102, a high concentration p-type impurity region 104 is provided as an emitter region, and an emitter metal electrode 107 is in contact with it. A (second) high concentration p-type impurity region for a collector electrode 105 is provided outside the n-type impurity region 102 so as to be in contact with the high concentration n-type impurity region 103. The base and the collector are used in the same potential, and thus a base/collector metal electrode 108 is brought into contact with the high concentration n-type impurity region for a base electrode 103 and the high concentration p-type impurity region for a collector electrode 105. An area between the emitter region 104 and the high concentration n-type impurity region for a base electrode 103 is separated by a polycrystalline silicon 106 so that the emitter region 104 is formed in the self-aligning manner.

Figure 2:
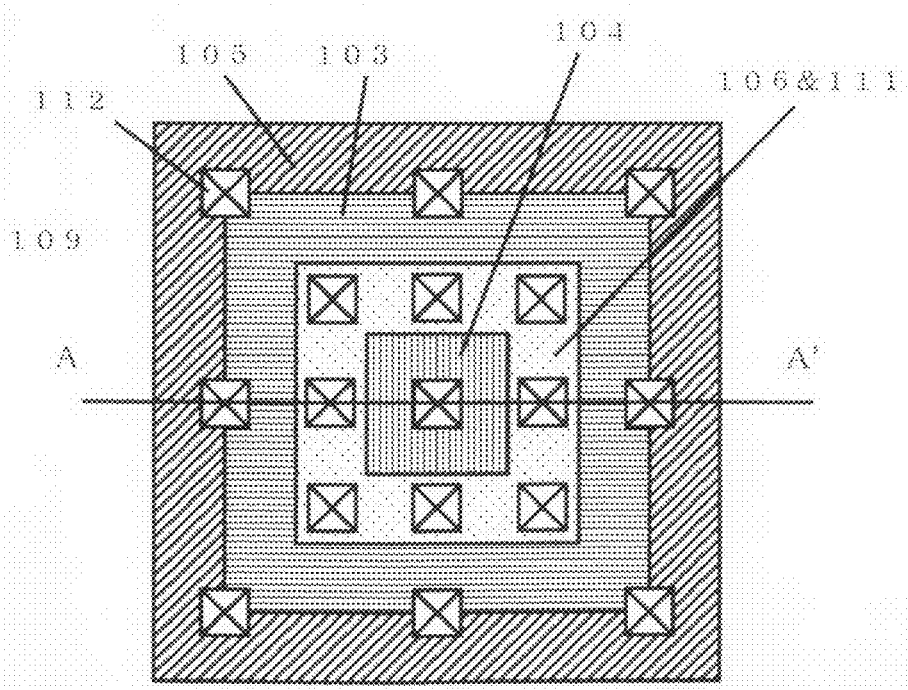
FIG. 2 is a plan view showing a main portion of the bipolar transistor according to the first embodiment of the present invention.

FIG. 2 is a plan view of the bipolar transistor according to the first embodiment of the present invention. A portion surrounded by the polycrystalline silicon 106 is the high concentration p-type impurity region 104 serving as the emitter region, and the high concentration n-type impurity region for a base electrode 103 is provided so at to surround the polycrystalline silicon. The high concentration p-type impurity region for a collector electrode 105 is provided so as to surround the high concentration n-type impurity region for a base electrode 103, and a field insulating film 109 is provided outside thereof.

Figure 3A:
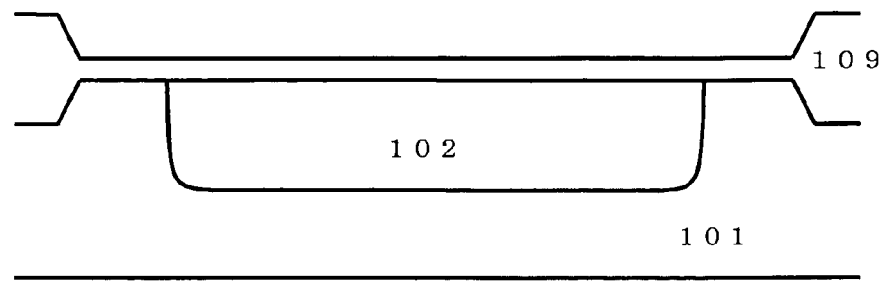
FIGS. 3A to 3E are sectional views taken along the line A-A' of FIG. 2, showing processes for a main portion of a semiconductor device according to the first embodiment of the present invention.

Next, an embodiment of a method of manufacturing the bipolar transistor shown in FIGS. 1 and 2 is described with reference to FIGS. 3A to 3E. FIG. 3A is a view showing that the n-type impurity region 102 to become the base region is manufactured in the p-type substrate 101 to become the collector region. The p-type substrate 101 is generally formed with a concentration of about $1 \times 10^{14}$ to $1 \times 10^{15}$ cm$^{-3}$. The n-type impurity region 102 is doped with n-type impurities, for example, phosphorus with the concentration of about $1 \times 10^{12}$ to $1 \times 10^{13}$ cm$^{-2}$ by ion implantation, and is thermally diffused, to thereby manufacture the n-type impurity region 102 with the concentration of about $1 \times 10^{16}$ to $5 \times 10^{16}$ cm$^{-3}$. Subsequently, a field insulating film 109 is formed by local oxidation of silicon (LOCOS) with a thickness of about 500 to 1,000 nm to become a device isolation region.

Figure 3B:
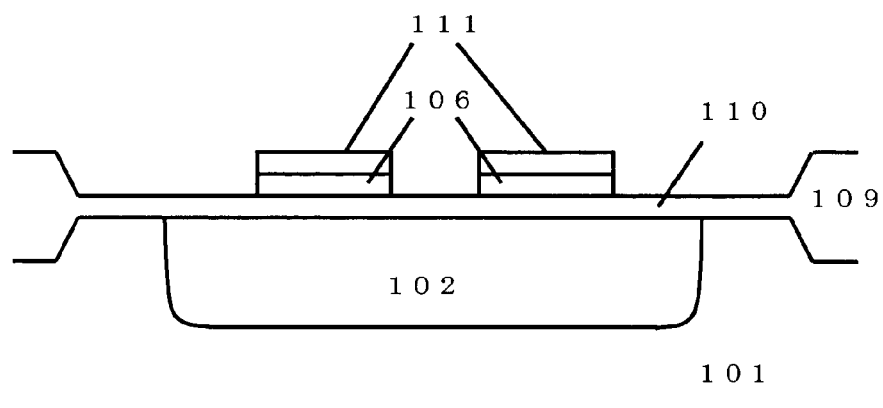

FIG. 3B is a view showing that, in order to form the emitter region 104 in the self-aligning manner, the polycrystalline silicon 106 is deposited on a gate insulating film 110 to be patterned by etching. In this case, it is assumed that the polycrystalline silicon 106 having an n-type conductivity is used, and a threshold value thereof may be raised so that a parasitic MOS transistor does not operate under the polycrystalline silicon 106. In order to obtain the n-type conductivity, n-type impurities, for example, arsenic is injected by ion implantation with the concentration of about $5 \times 10^{15}$ cm$^{-2}$, and thereafter the semiconductor substrate 101 thus obtained is subjected to heat treatment at a temperature of about 850 degrees to diffuse the impurities injected in the polycrystalline silicon 106. For reduction in sheet resistance, a refractory metal silicide 111 is deposited with a thickness of about 100 nm. Patterning is performed by photoresist and etching is performed, whereby the refractory metal silicide 111 can be formed. Note that the ion implantation is employed in this embodiment when the polycrystalline silicon 106 is made to have the n-type conductivity, but predeposition of phosphorus or arsenic may be performed. Further, in order to raise the threshold value, impurities may be doped under the polycrystalline silicon 106.

Figure 3C:
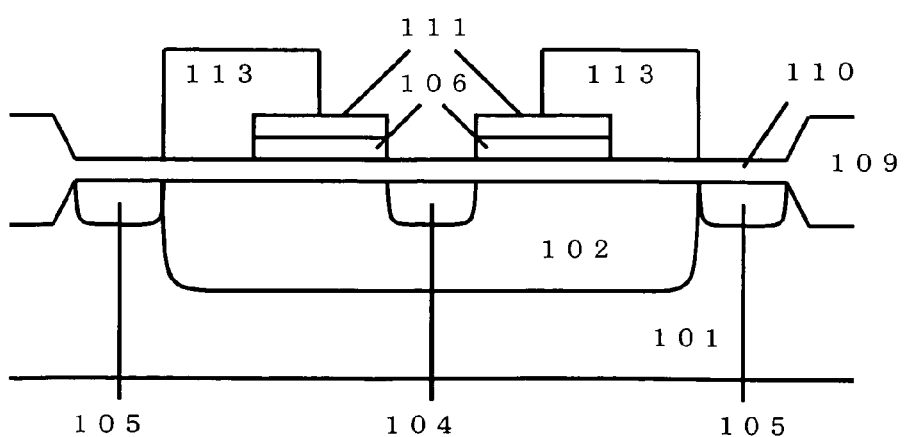

FIG. 3C is a view showing that patterning is performed with a photoresist 113, and high concentration p-type impurities are doped by ion implantation to form the emitter region and the high concentration impurity region for a collector electrode. In this case, the high concentration p-type impurity region is formed by doping high concentration p-type impurities, for example, BF2 with the concentration of about $5 \times 10^{15}$ cm$^{-2}$ to obtain the concentration of about $5 \times 119$ cm$^{-1}$ to $1 \times 10^{21}$ cm$^{-1}$.

Figure 3D:
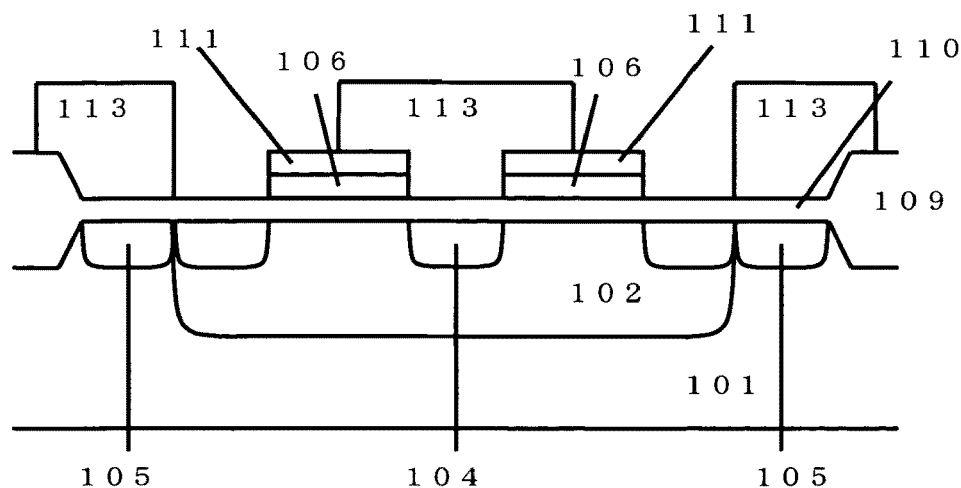

FIG. 3D is a view showing that pattering is performed with the photoresist 113, and high concentration n-type impurities are doped by ion implantation to form the high concentration impurity region for a base electrode. In this case, the high concentration n-type impurity region is formed by doping high concentration n-type impurities, for example, arsenic with the concentration of about $5\times10^{15}$ cm$^{-2}$ to obtain the concentration of about $5\times10^{19}$ cm$^{-3}$ to $1\times10^{21}$ cm$^{-3}$.

Figure 3E:
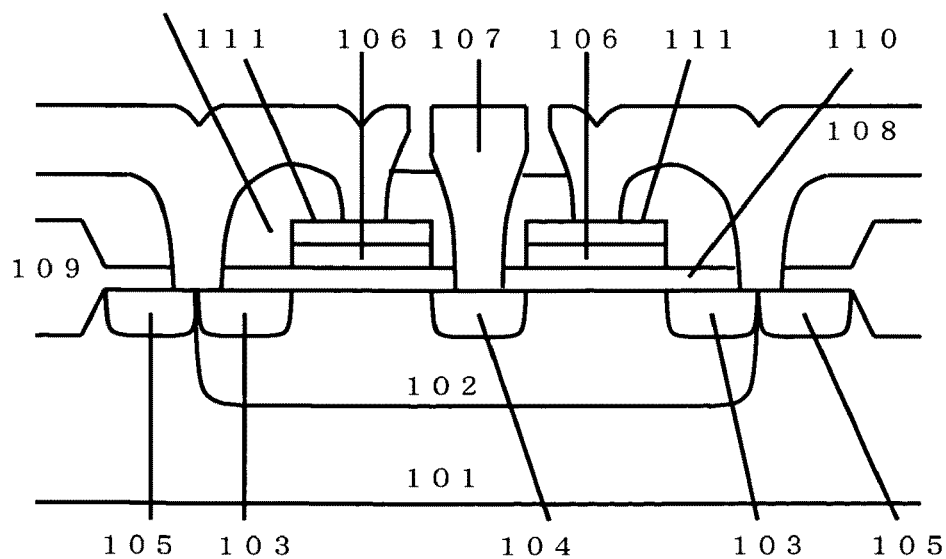

Next, an interlayer insulating film (not shown) is deposited, and the photoresist is patterned and etching is performed to obtain a common contact with the high concentration n-type impurity region for a base electrode 103 and the high concentration p-type impurity region for a collector electrode 105. After that, as shown in FIG. 3E, the emitter metal electrode, the base-collector metal electrode, and a polycrystalline silicon metal electrode 108. In this case, the polycrystalline silicon metal electrode 108 has an equal potential to the base-collector metal electrode, but the polycrystalline silicon metal electrode 108 can have an equal potential to the emitter.

Second Embodiment

Figure 4:
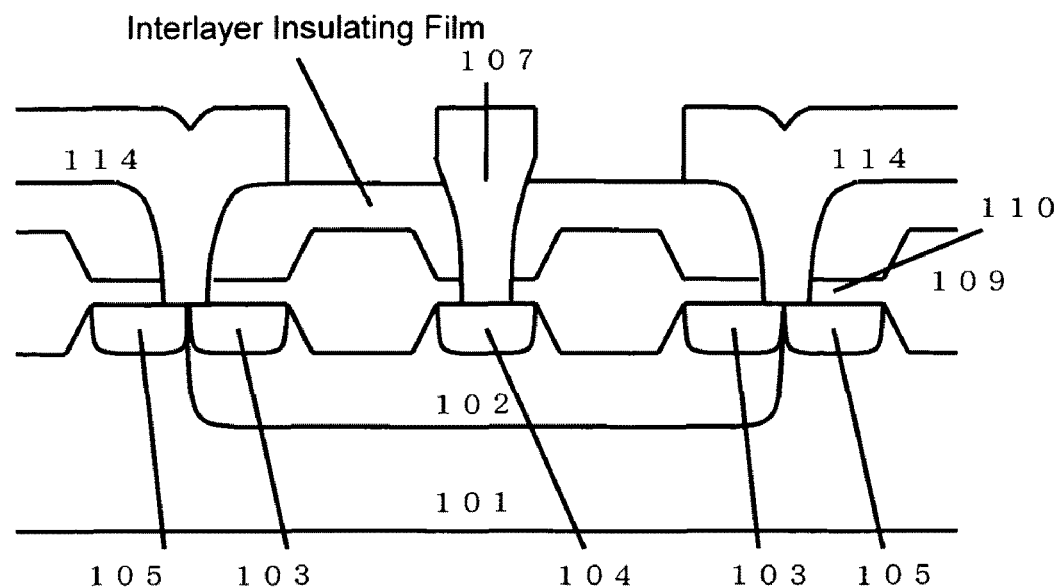
FIG. 4 is a sectional view of a bipolar transistor according to a second embodiment of the present invention.

FIG. 4 shows a bipolar transistor according to a second embodiment of the present invention. The emitter region 104 is formed so as to be self-aligned with the device isolation insulating film. When variation in the shape of the polycrystalline silicon is large, the device isolation insulating film may be used to form the bipolar transistor as in the second embodiment of the present invention.

Third Embodiment

Figure 5:
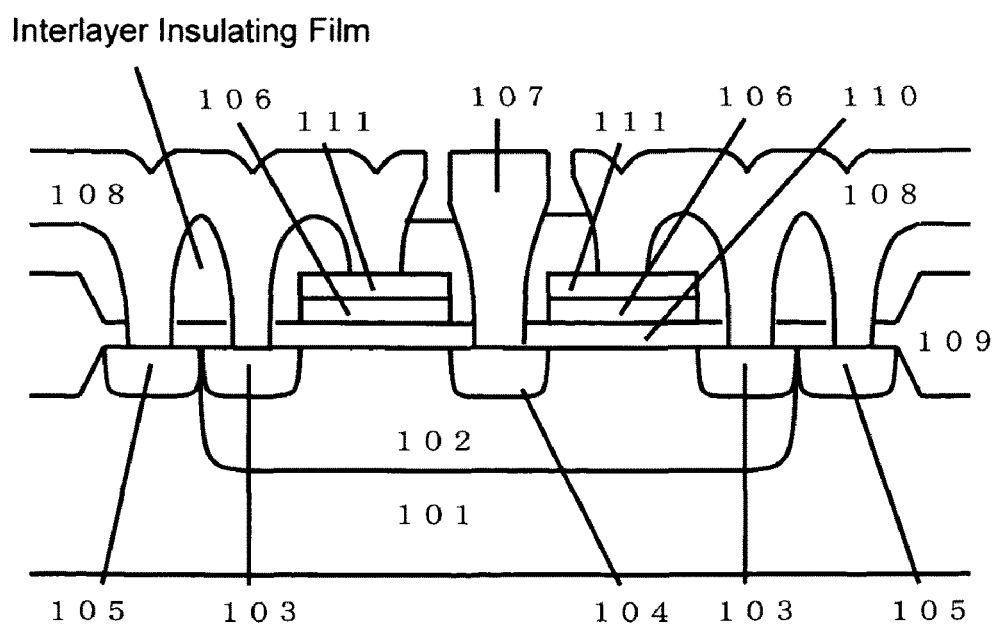
FIG. 5 is a sectional view of a bipolar transistor according to a third embodiment of the present invention.
Figure 6:
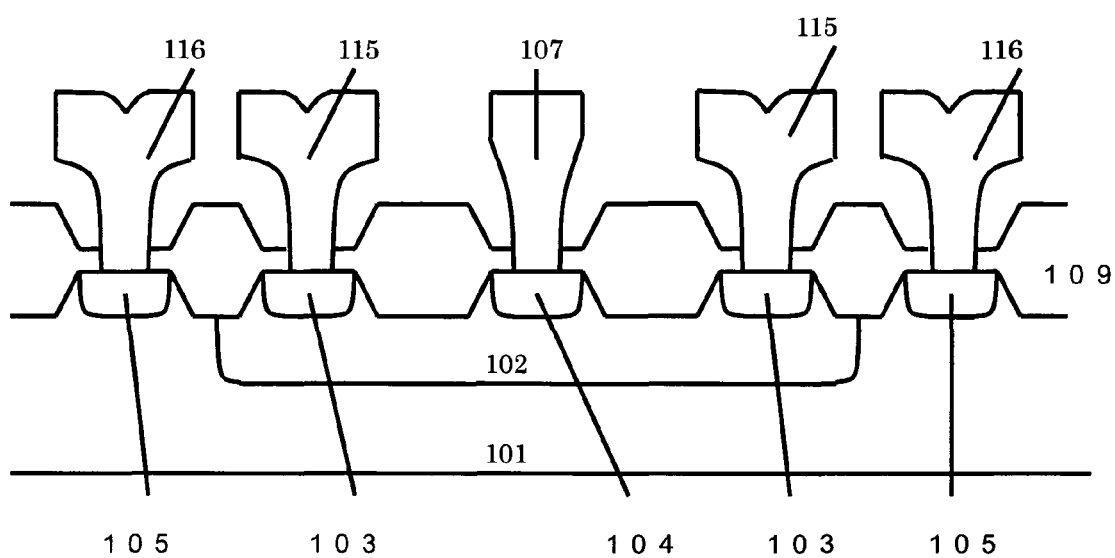
FIG. 6 is a sectional view showing an example of a conventional bipolar transistor.

FIG. 5 shows a bipolar transistor according to a third embodiment of the present invention. The emitter region 104 is formed to be self-aligned with the polycrystalline silicon 106, and the high concentration n-type impurity region for a base electrode 103 and the high concentration p-type impurity region for a collector electrode 105 are provided with separate contacts. In this case, the polycrystalline silicon metal electrode has the same potential to the base-collector metal electrode.

Note that the description has been made on the PNP bipolar transistor in the embodiments. The similar structure can be applied to an NPN bipolar transistor using an n-type substrate.

What is claimed is:

1. A semiconductor device having a bipolar transistor, the bipolar transistor comprising:
   a collector region having a first conductivity type disposed on a surface of a semiconductor substrate having the first conductivity type;
   a base region having a second conductivity type disposed in the collector region;
   an emitter region having the first conductivity type disposed in the base region;
   a high concentration first conductivity type region for a collector electrode disposed in the collector region; and
   a high concentration second conductivity type region for a base electrode disposed in the base region;
   wherein the high concentration first conductivity type region for a collector electrode and the high concentration second conductivity type region for a base electrode contact directly with each other so that the collector region and the base region have a same potential; and
   wherein the high concentration first conductivity type region for a collector electrode and the high concentration second conductivity type region for a base electrode are disposed adjacent to and in direct contact with one another via a common metal electrode disposed in a single contact hole formed in an interlayer insulating film of the semiconductor device so that the high concentration first conductivity type region for a collector electrode and the high concentration second conductivity type region for a base electrode have the same potential.

2. A semiconductor device according to claim 1; wherein the emitter region is self-aligned via a device isolation insulating film.

3. A semiconductor device according to claim 1; wherein the emitter region is self-aligned via a polycrystalline silicon arranged on the surface of the semiconductor substrate.

4. A semiconductor device according to claim 3; wherein the polycrystalline silicon has a potential equal to a potential of the base region and a potential of the collector region.

5. A semiconductor device according to claim 3; wherein the polycrystalline silicon has a potential equal to a potential of the emitter region.

6. A semiconductor device according to claim 3; wherein the polycrystalline silicon has the second conductivity type.

7. A semiconductor device according to claim 1; wherein the emitter region comprises a self-aligned emitter region.

8. A semiconductor device comprising:
   a semiconductor substrate having a first conductivity type;
   a collector region disposed on a surface of a semiconductor substrate and having the first conductivity type;
   a base region disposed in the collector region and having a second conductivity type different from the first conductivity type;
   a self-aligned emitter region disposed in the base region and having the first conductivity type;
   a first high concentration impurity region having the second conductivity type and being disposed in the base region;
   a second high concentration impurity region disposed adjacent to the first high concentration impurity region and having the first conductivity type, the second high concentration impurity region being disposed outside of the base region and in direct contact with the first high concentration impurity region so that the base region and the collector region have a same potential; and
   a metal electrode connected to each of the first and second high concentration impurity regions via a single contact hole formed in an interlayer insulating film of the semiconductor device.

9. A semiconductor device comprising:
   a semiconductor substrate having a first conductivity type;
   a collector region disposed on a surface of a semiconductor substrate and having the first conductivity type;
   a base region disposed in the collector region and having a second conductivity type different from the first conductivity type;
   a self-aligned emitter region disposed in the base region and having the first conductivity type;
   a first high concentration impurity region having the second conductivity type and being disposed in the base region;
   a second high concentration impurity region disposed adjacent to the first high concentration impurity region and having the first conductivity type, the second high concentration impurity region being disposed outside of the base region and in direct contact with the first high concentration impurity region so that the base region and the collector region have a same potential; and
   a metal electrode connected to each of the first and second high concentration impurity regions via respective contact holes formed in an interlayer insulating film of the semiconductor device.

10. A semiconductor device comprising:
    a semiconductor substrate having a first conductivity type;

a collector region disposed on a surface of a semiconductor substrate and having the first conductivity type;

a base region disposed in the collector region and having a second conductivity type different from the first conductivity type;

a self-aligned emitter region disposed in the base region and having the first conductivity type, the self-aligned emitter region being positioned in a self-aligned manner by a polycrystalline silicon having the second conductivity type and arranged on the surface of the semiconductor substrate;

a first high concentration impurity region having the second conductivity type and being disposed in the base region; and a second high concentration impurity region having the first conductivity type and being disposed outside of the base region and in direct contact with the first high concentration impurity region so that the base region and the collector region have a same potential.

* * * * *